(12) United States Patent
Song et al.

(10) Patent No.: US 8,345,136 B2
(45) Date of Patent: Jan. 1, 2013

(54) CMOS IMAGE SENSOR

(75) Inventors: Hyun-chul Song, Seoul (KR);
Seong-deok Lee, Suwon-si (KR);
Won-hee Choe, Gyeongju-si (KR);
Jae-hyun Kwon, Yongin-si (KR);
Kang-eui Lee, Yongin-si (KR)

(73) Assignees: Samsung Electronics Co., Ltd., Suwon (KR); Samsung Electro-Mechanics Co., Ltd., Suwon (KR)

( * ) Notice: Subject to any disclaimer, the term of this patent is extended or adjusted under 35 U.S.C. 154(b) by 877 days.

(21) Appl. No.: 12/073,898

(22) Filed: Mar. 11, 2008

(65) Prior Publication Data

US 2009/0032852 A1 Feb. 5, 2009

(30) Foreign Application Priority Data

Jul. 31, 2007 (KR) .................. 10-2007-0077016

(51) Int. Cl.
*H04N 5/335* (2006.01)
(52) U.S. Cl. .................................................. 348/308
(58) Field of Classification Search .................. 348/296, 348/302, 308; 250/208.1
See application file for complete search history.

(56) References Cited

U.S. PATENT DOCUMENTS

| | | | | |
|---|---|---|---|---|
| 7,091,531 | B2 * | 8/2006 | Boemler | 257/222 |
| 7,399,951 | B2 * | 7/2008 | Morimoto et al. | 250/208.1 |
| 2006/0256221 | A1 * | 11/2006 | Mckee et al. | 348/308 |
| 2007/0153109 | A1 * | 7/2007 | Lule | 348/308 |
| 2008/0315272 | A1 * | 12/2008 | Parks | 257/292 |
| 2009/0045319 | A1 * | 2/2009 | Sugawa et al. | 250/208.1 |

FOREIGN PATENT DOCUMENTS

| | | |
|---|---|---|
| JP | 2004-056048 | 2/2004 |
| JP | 2006-157009 | 6/2006 |
| JP | 2006-217548 | 8/2006 |
| JP | 2006245522 A * | 9/2006 |
| KR | 10-2006-0133736 | 12/2006 |

* cited by examiner

*Primary Examiner* — Timothy J Henn
(74) *Attorney, Agent, or Firm* — Staas & Halsey LLP

(57) ABSTRACT

A CMOS (Complementary Metal-Oxide Semiconductor) image sensor is provided. A CMOS image sensor includes a first light-receiving unit converting light into charge, a first floating diffusion region, in which a first potential corresponding to the converted amount of charge is generated and a second floating diffusion region, to which the charge in the first floating diffusion region is transmitted, and in which a second potential is generated, wherein a wide dynamic range signal is acquired from the first floating diffusion region, a high-sensitively signal is acquired from the second floating diffusion region, and the acquired signals are synthesized and output.

12 Claims, 6 Drawing Sheets

CMOS IMAGE SENSOR

CROSS REFERENCE TO RELATED APPLICATION

This application claims priority from Korean Patent Application No. 10-2007-0077016 filed on Jul. 31, 2007 in the Korean Intellectual Property Office, the disclosure of which is incorporated herein by reference in its entirety.

BACKGROUND OF THE INVENTION

1. Field of the Invention

The present invention relates to a semiconductor technology, and, in particular, to a CMOS (Complementary Metal-Oxide Semiconductor) image sensor that has an expanded dynamic range.

2. Description of the Related Art

In recent years, high-resolution camera-equipped apparatuses, such as digital cameras, camera-equipped cellular phones, and surveillance cameras, have become widespread. As an imaging device for such a camera, a CCD (Charge Coupled Device) or a CMOS (Complementary Metal-Oxide Semiconductor) image sensor is used.

The CMOS image sensor has features of ease of manufacturing and low cost compared with the CCD, and thus it is popular in solid-state imaging. Further, a unit pixel of the CMOS image sensor is composed of MOS transistors, and thus it can be implemented in a smaller area than that of the CCD, thereby providing high resolution. In addition, signal-processing logic can be formed in an image circuit, in which pixels are formed, such that the image circuit and the signal-processing circuit can be incorporated into a single body.

Since the CMOS image sensor generally has a dynamic range of approximately 60 dB, there is a limit to generating an image in a wide illuminance range. For this reason, in a screen having a bright image and a dark image, a bright portion may be saturated and become white, and a dark portion may not be expressed.

In addition, as a digital camera or a camera-equipped cellular phone is reduced in size, low-voltage driving is performed due to demands for reducing a unit area in the pixels of the image sensor and realizing low power consumption, which makes it difficult to ensure a sufficient dynamic range.

In the related art, in order to solve the above-described problems, the structure shown in FIG. 1 is used to expand the dynamic range of the image sensor.

FIG. 1 is a circuit diagram showing a unit pixel having a general 4-T structure in a CMOS image sensor.

Referring to FIG. 1, the pixel having a 4-T structure is composed of one photodiode (PD) 110, and four NMOS transistors, that is, a transfer transistor (Tx) 120, a reset transistor (Rx) 122, a drive transistor (Dx) 124, and a select transistor (Sx) 126.

In a state where the transfer transistor (Tx) 120 is turned off, if light is irradiated onto the surface of the photodiode (PD) 110, holes and electrons are separated. Then, the holes flow to a ground to be then removed, and electrons accumulate in the photodiode (PD) 110.

The transfer transistor (Tx) 120 functions as a transmission channel to apply a predetermined voltage to a gate 121 of the transfer transistor (Tx) 120, and to transfer the electrons accumulated in the photodiode (PD) 110 by light to a floating diffusion region (FD) 130. Further, the transfer transistor (Tx) 120 performs a reset function to completely remove the electrons from the photodiode (PD) 110.

The reset transistor (Rx) 122 resets the floating diffusion region (FD) 130 by setting the potential of the floating diffusion region (FD) 130 to a desired value and eliminating charge. That is, the reset transistor (Rx) 122 eliminates the charge that has accumulated in the floating diffusion region (FD) 130 for signal detection.

The drive transistor (Dx) 124 operates according to the charge accumulated in the floating diffusion region (FD) 130, and functions as a buffer amplifier having the configuration of a source follower. The select transistor (Sx) 126 is switched for addressing.

If charge accumulates in the photodiode (PD) 110, a high voltage is applied to a gate of the reset transistor (Rx) 122 to set the voltage of the floating diffusion region (FD) 130 to $V_{DD}$, and then a corresponding voltage value is read. Next, a high voltage is applied to the gate of the transfer transistor (Tx) 120 to transfer the charge that has accumulated in the photodiode (PD) 110 to the floating diffusion region (FD) 130, a corresponding voltage value is read, and subsequently a difference between the read voltage values is read.

In this structure, in order to expand the dynamic range, the capacitance of the floating diffusion region (FD) 130 is increased to receive the charge from the photodiode (PD) 110 without overflow.

However, if the capacitance is increased, sensitivity of the CMOS image sensor is decreased, and a dark image may not be expressed. Therefore, it is not desirable to simply increase the capacitance of the floating diffusion region (FD) 130.

SUMMARY OF THE INVENTION

An object of the present invention is to provide a CMOS image sensor, in which a plurality of floating diffusion regions are provided in a pixel, having the advantage of obtaining an expanded dynamic range without sacrificing sensitivity.

Objects of the present invention are not limited to those mentioned above, and other objects of the present invention will be apparent to those skilled in the art through the following description.

According to the embodiments of the present invention, a plurality of floating diffusion regions are provided in a pixel to have different capacitance, and thus an expanded dynamic range can be obtained without sacrificing sensitivity.

According to the embodiments of the present invention, the floating diffusion regions are separated from each other. Therefore, at low illuminance, a vivid image can be obtained with high sensitivity. In addition, at high illuminance, a vivid image can be obtained without causing an image to be saturated and whitened.

BRIEF DESCRIPTION OF THE DRAWINGS

The above and other features and advantages of the present invention will become apparent by describing in detail preferred embodiments thereof with reference to the attached drawings in which.

DESCRIPTION OF THE PREFERRED EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims.

Figure 2:
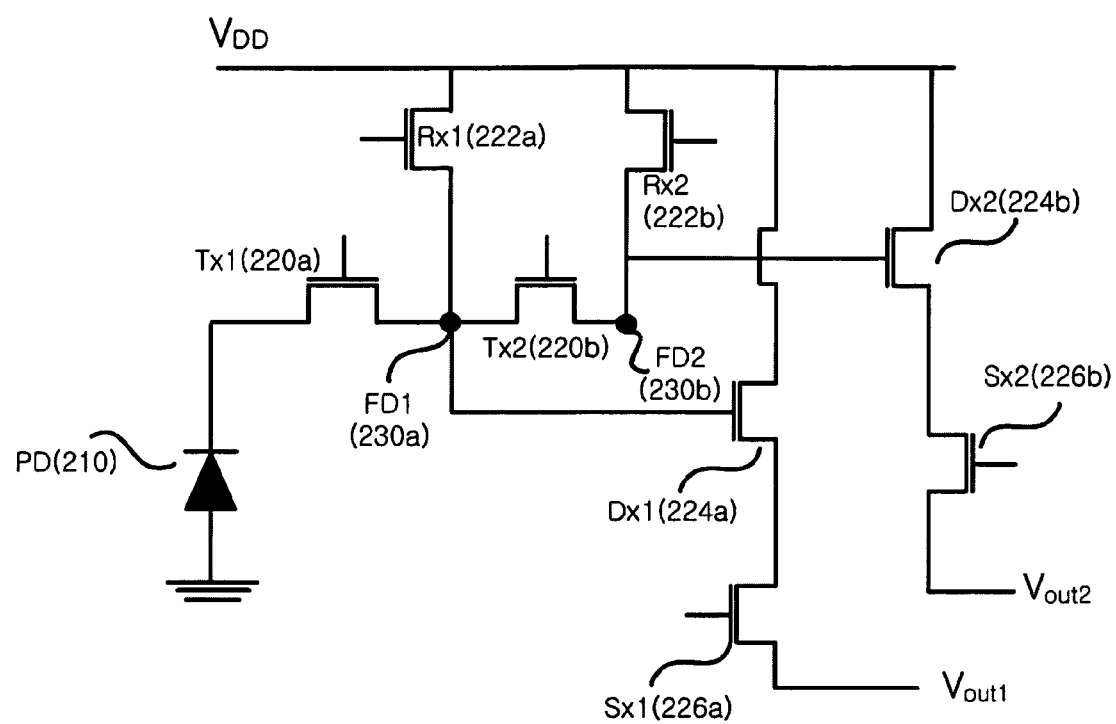
FIG. 2 is a circuit diagram showing a unit pixel of a CMOS image sensor having two floating diffusion regions according to an embodiment of the present invention.

FIG. 2 is a circuit diagram showing a unit pixel of a CMOS image sensor having two floating diffusion regions according to an embodiment of the present invention.

Referring to FIG. 2, a CMOS image sensor according to an embodiment of the present invention has a first floating diffusion region (FD1) 230a and a second floating diffusion region (FD2) 230b per unit pixel. FD1 230a and FD2 230b are separated from each other by a second transfer transistor (Tx2) 220b. In addition, a first transfer transistor (Tx1) 220a is disposed between a photodiode (PD) 210 and FD1 230a.

The photodiode (PD) 210 functions as a light-receiving unit that converts light into charge. It should be understood that any unit can be applied to the present invention insofar as it is a light-receiving unit that can convert light into charge.

FD1 230a is connected to a gate of a first drive transistor (Dx1) 224a and a first reset transistor (Rx1) 222a, and FD2 230b is connected to a gate of a second drive transistor (Dx2) 224b and a second reset transistor (Rx2) 222b.

A final image for a pixel is obtained by synthesizing signals Vout1 and Vout2 that are output from a first select transistor (Sx1) 226a and a second select transistor (Sx2) 226b.

Figure 1:
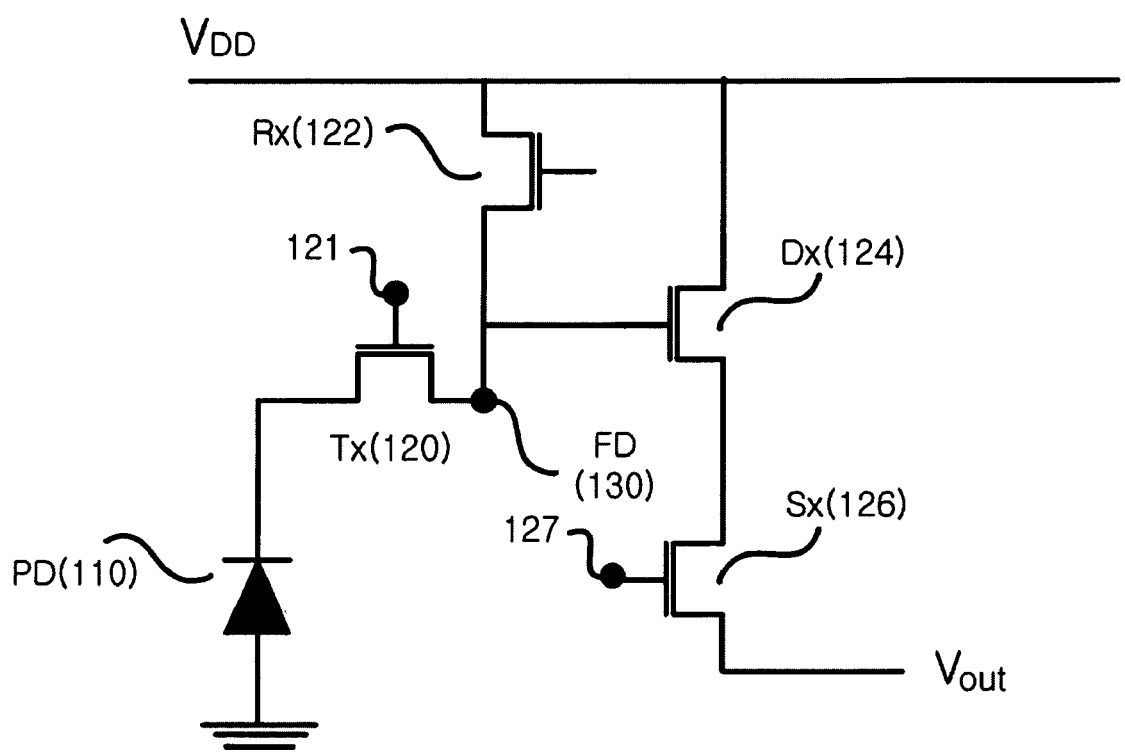
FIG. 1 is a circuit diagram showing a unit pixel having a general 4-T structure in a CMOS image sensor.

The transfer transistors 220a and 220b, the reset transistors 222a and 222b, the drive transistors 224a and 224b, and the select transistors 226a and 226b shown in FIG. 2 have the same functions as the transistors shown in FIG. 1.

Referring to FIG. 2, FD1 230a is disposed close to the four transistors Tx1 220a, Tx2 220b, Rx1 222a, and Dx1 224a, and thus it has a capacitance larger than FD2 230b that is disposed close to the three transistors Tx2 220b, Rx2 222b, and Dx2 224b.

At this time, the capacitance of FD1 230a is maximized within a predetermined range to receive large amounts of charge while the sensitivity is low. Further, the capacitance of FD2 230b is minimized within the predetermined range to increase the sensitivity while not receiving large amounts of charge.

In such a manner, a signal having a wide dynamic range with respect to illuminance but low sensitivity can be acquired in FD1 230a, and a signal having a small dynamic range with respect to illuminance but high sensitivity can be acquired in FD2 230b.

That is, the charge accumulated in the photodiode 210 is transmitted to FD1 230a through the first transfer transistor (Tx1) 220a to obtain a wide dynamic range signal, and then the wide dynamic range signal is output as Vout1 through Dx1 224a and Sx1 226a. Next, the wide dynamic range signal obtained in FD1 230a is transmitted to FD2 230b through the second transfer transistor (Tx2) 220b to obtain a high-sensitive signal, and then the high-sensitivity signal is outputs as Vout2 through Dx2 224b and Sx2 226b.

The signals Vout1 and Vout2 are synthesized, thereby obtaining the final image for a pixel.

Figure 3:
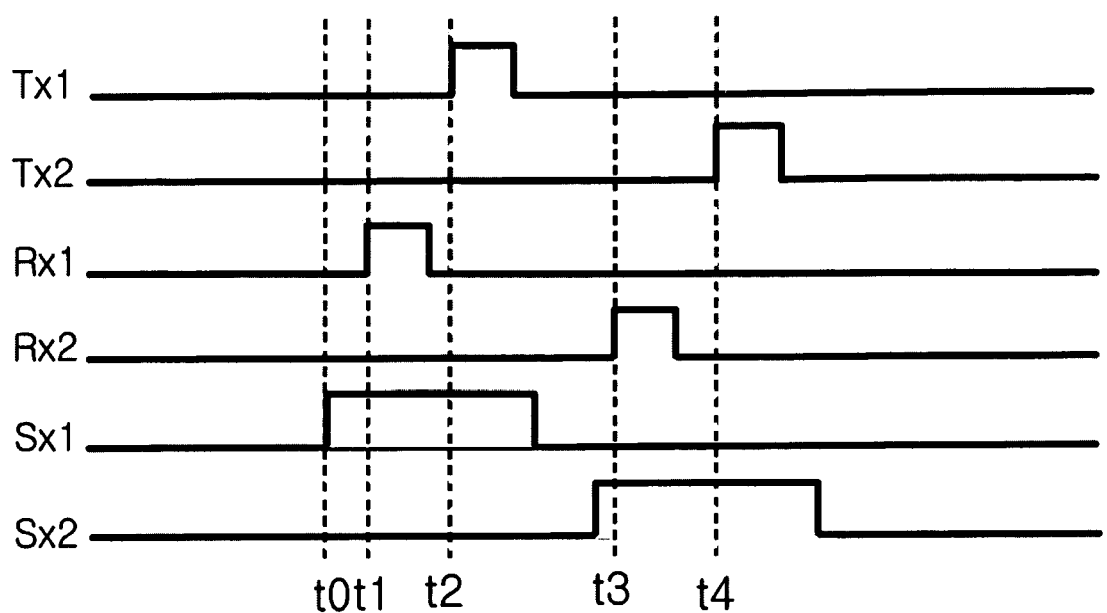
FIG. 3 is a timing chart illustrating the operation of the circuit shown in FIG. 2.

FIG. 3 is a timing chart illustrating the operation of the circuit shown in FIG. 2.

Referring to FIG. 3, Sx1 226a is turned on at time t0 when a selection control signal rises, and a column including a corresponding CMOS pixel element is selected.

Next, Rx1 222a is turned on at time t1 to reset FD1 230a to $V_{DD}$, and then a corresponding voltage value is read.

At time t2, a high voltage is applied to a gate of the Tx1 220a to transmit the charge accumulated in the photodiode 210 to FD1 230a, and a corresponding voltage value is read. A difference between the two voltage values is output as a final signal value. That is, the output signal covers a wide range of illuminance, and thus a vivid image can be obtained with high illuminance without causing saturation.

After time t2, Sx2 226b is turned on, and a column including a corresponding CMOS pixel element is selected. In this case, the same column is selected by Sx1 226a and Sx2 226b.

At time t3, the Rx2 222b is turned on to rest FD2 230b to $V_{DD}$, and then a corresponding voltage value is read. Next, at time t4, a high voltage is applied to a gate of the Tx2 220b to transmit the charge accumulated in FD1 230a to FD2 230b, and then a corresponding voltage value is read. A difference between the two voltage values is output as a final signal value. In FD2 230b, a high-sensitivity signal is output due to low capacitance, such that a vivid image can be obtained with low illuminance.

As a result, the two final signal values are synthesized after a time t4, such that an illuminance range can be expanded while the sensitivity of the CMOS image sensor can be maintained.

Figure 4:
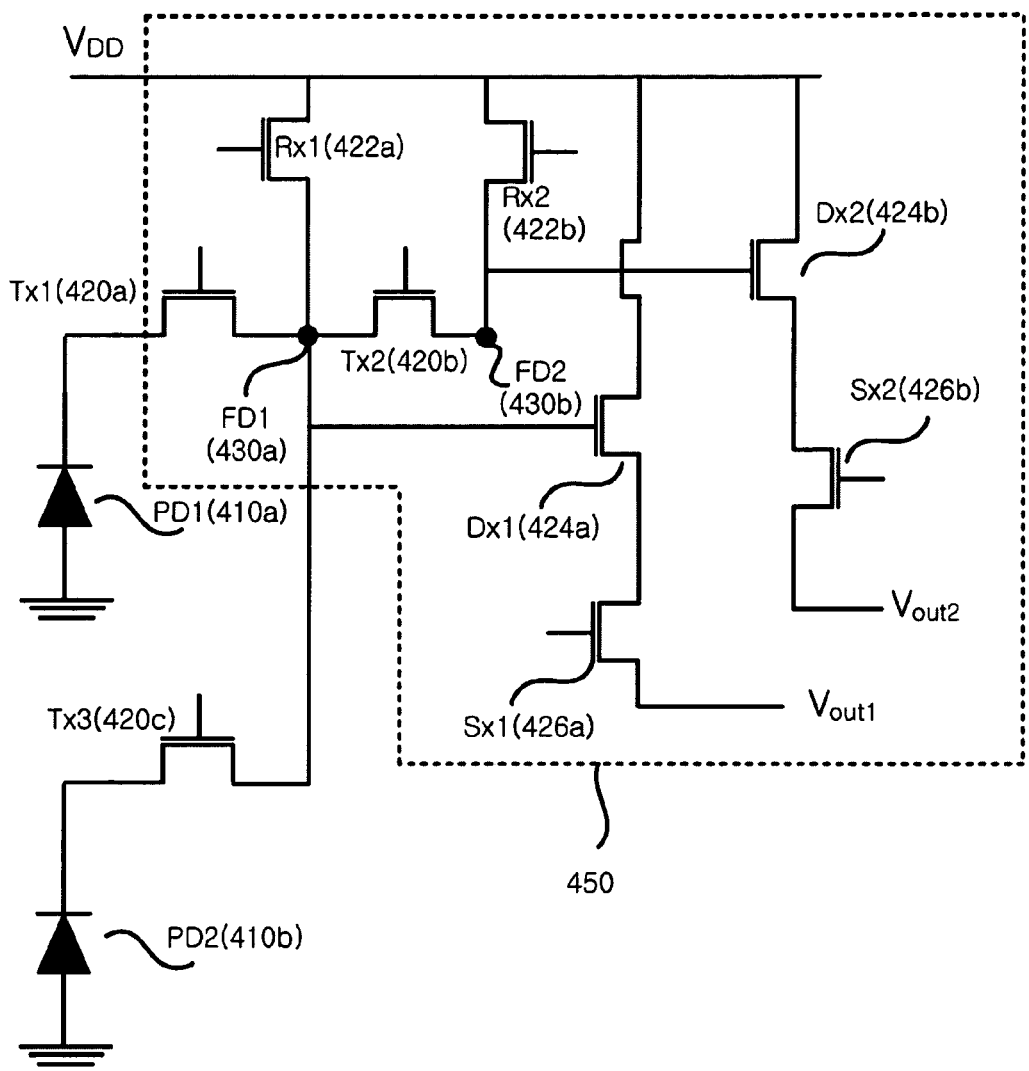
FIG. 4 is a circuit diagram showing the structure of a CMOS image sensor according to another embodiment of the present invention.

FIG. 4 is a circuit diagram showing the structure of a CMOS image sensor according to another embodiment of the present invention. Referring to FIG. 4, images from two pixels of the CMOS image sensor are processed by a single circuit.

That is, an image-processing circuit block 450 shown in FIG. 4 has the same configuration and function as the circuit shown in FIG. 2. In FIG. 4, however, a first floating region (FD1) 430a is connected to a third transfer transistor (Tx3) 420c, and Tx3 420c is connected to a second photodiode (PD2) 410b.

A first photodiode (PD1) 410a and a second photodiode (PD2) 410b respectively function as light-receiving units of first and second pixels in the CMOS image sensor.

For example, charge collected by the PD1 410a is transmitted to FD1 430a and FD2 430b under the control of Tx1 420a, thereby obtaining output signals Vout1 and Vout2 for the first pixel. In this case, since Tx3 420c does not operate, charge collected in the PD2 410b is not transmitted to FD1 430a.

Subsequently, the Tx1 420a does not operate and the Tx3 420c operates. Then, the charge collected in the PD2 410b is transmitted to FD1 430a and FD2 430b, thereby obtaining output signals Vout1 and Vout2 for the second pixel. In this case, since the Tx1 420a does not operate, the charge collected in the PD1 410a is not transmitted to FD1 430a.

That is, a single image-processing circuit block 450 is shared by two light-receiving units, and thus the integration of the CMOS image sensor can be increased.

Figure 5:
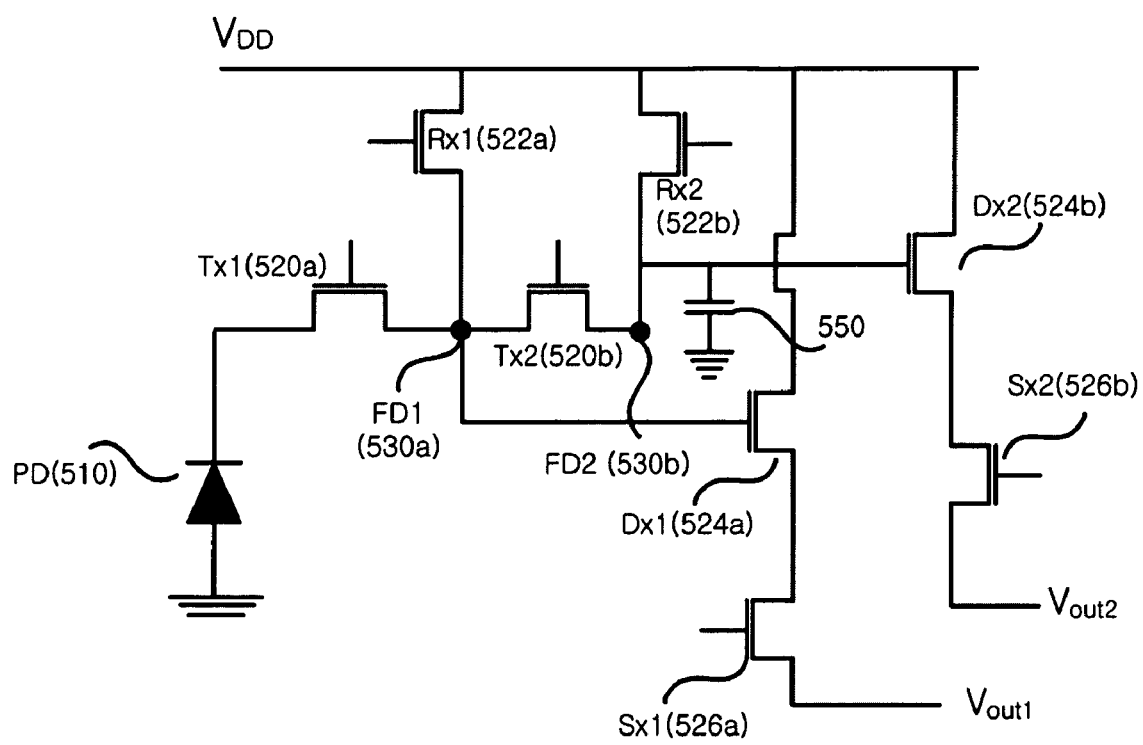
FIG. 5 is a circuit diagram showing a unit pixel of a CMOS image sensor according to still another embodiment of the present invention.

FIG. 5 is a circuit diagram showing a unit pixel of a CMOS image sensor according to still another embodiment of the present invention.

Referring to FIG. 5, it can be seen that the circuit shown in FIG. 5 has the same configuration as the circuit shown in FIG. 2, excluding a capacitor 550.

The capacitor 550 is connected to a gate of a Dx2 524b, that is, a FD2 530b, to increase capacitance of FD2 530b. Accordingly, FD1 530a functions as a high-sensitivity output unit, and FD2 530b functions as a wide dynamic range/low-sensitivity output unit, unlike the circuit shown in FIG. 2, in which FD1 230a functions as a wide dynamic range output signal and FD2 230b functions as a high-sensitivity output unit.

Therefore, referring to FIG. 5, the wide dynamic range signal is output as Vout2, and the high-sensitivity signal is output as Vout1.

Figure 6:
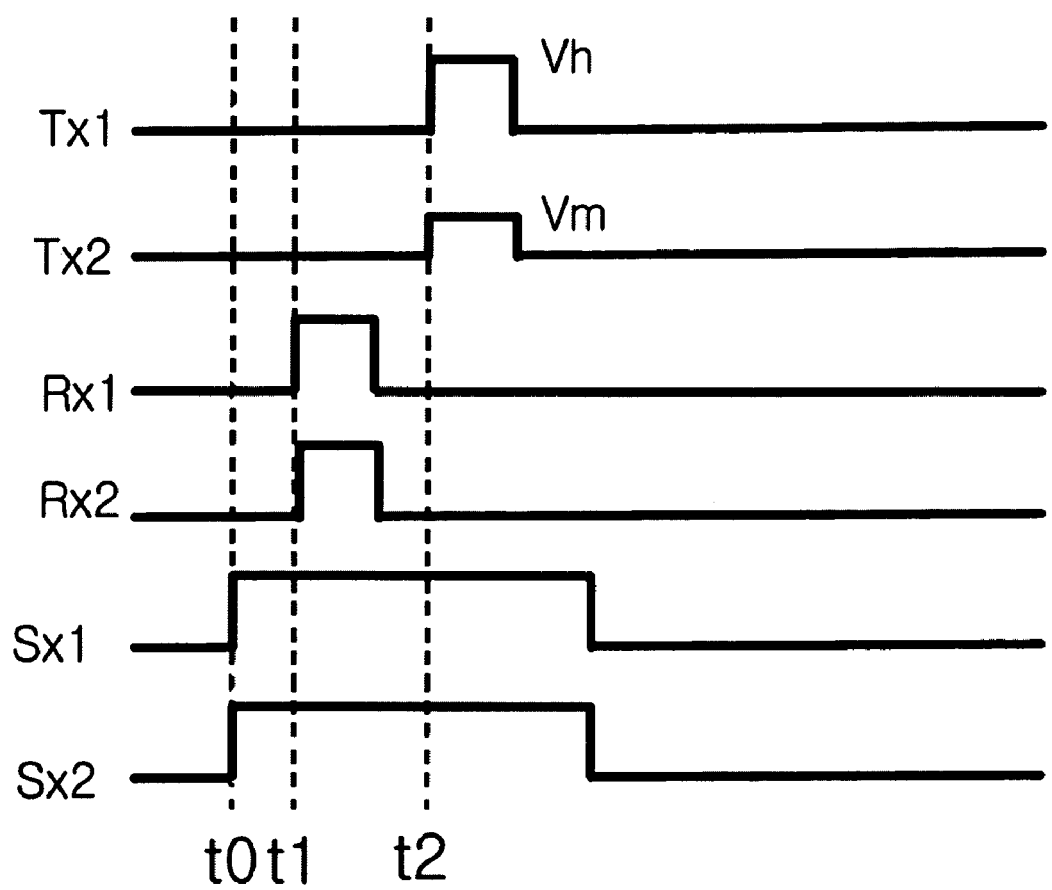
FIG. 6 is a timing chart illustrating the operation of the circuit shown in FIG. 5.

FIG. 6 is a timing chart illustrating the operation of the circuit shown in FIG. 5.

Referring to FIG. 6, Sx1 526a and the Sx2 526b are simultaneously turned on at time t0 when the selection control signal rises, and a column including a corresponding CMOS pixel element is selected.

Next, at time t1, the reset transistor (Rx1) 522a and the reset transistor (Rx2) 522b are simultaneously turned on to set FD1 530a and FD2 530b to $V_{DD}$, and then a corresponding voltage value is read.

At time t2, a voltage $V_h$ is applied to the first transfer transistor (Tx1) 520a, and a voltage $V_m$ is applied to the second transfer transistor (Tx2) 520b. At this time, the voltage $V_m$ is lower than the voltage $V_h$.

Subsequently, at time t2, FD2 530b receives the excessive charge in FD1 530a, such that a high-sensitivity signal is obtained from FD1 530a, and a low-sensitivity/wide dynamic range signal is obtained from FD2 530b. Next, the two signals are synthesized, thereby acquiring a wide dynamic range/high-sensitivity signal.

Similar to the CMOS image sensor shown in FIG. 4, the circuit shown in FIG. 5 can be shared by at least two light-receiving units. This change can be easily made by those skilled in the art from FIG. 4.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limitative, but illustrative in all aspects.

What is claimed is:

1. A complementary metal-oxide-semiconductor (CMOS) image sensor comprising:
a first light-receiving unit to convert light into charge;
a first floating diffusion region to receive a charge from the first light-receiving unit which is transmitted through a first transfer transistor, to generate a first potential corresponding to the charge;
a second floating diffusion region to receive a charge from the first floating diffusion region which is transmitted through a second transfer transistor, to generate a second potential,
wherein a wide dynamic range signal is acquired from the first floating diffusion region, a high-sensitivity signal is acquired from the second floating diffusion region, and the acquired signals are synthesized and output, and
wherein the first floating diffusion region is connected to a first reset transistor and the second floating diffusion region is disposed between the second transfer transistor and a second reset transistor, and the first and second floating diffusion regions are not connected to a capacitor.

2. The CMOS image sensor of claim 1, wherein:
the first floating diffusion region is connected to a second light-receiving unit, and
the first light-receiving unit and the second light-receiving unit share the first floating diffusion region and the second floating diffusion region.

3. The CMOS image sensor of claim 1, wherein:
the first floating diffusion region has a capacitance larger than the second floating diffusing region.

4. The CMOS image sensor of claim 1, wherein:
the wide dynamic range signal acquired from the first floating diffusion region is output through a first drive transistor and a first select transistor,
the high-sensitively signal acquired from the second floating diffusion region is output through a second drive transistor and a second select transistor, and the acquired signals are then synthesized and output.

5. The CMOS image sensor of claim 2, wherein:
the first transfer transistor is disposed between the first light-receiving unit and the first floating diffusion region, and the second transfer transistor is disposed between the second light-receiving unit and the first floating diffusion region, and
the sharing of the first floating diffusion region and the second floating diffusion region by the first light-receiving unit and the second light-receiving unit comprises:
when the first transfer transistor operates, the charge converted by the first light-receiving unit is transmitted to the first floating diffusion region and the second floating diffusion region, and the second transfer transistor does not operate; and
when the second transfer transistor operates, a charge converted by the second light-receiving unit is transmitted to the first floating diffusion region and the second floating diffusion region, and the first transfer transistor does not operate.

6. A complementary metal-oxide-semiconductor (CMOS) image sensor comprising:
a plurality of pixels,
wherein each of the pixels includes a first floating diffusion region, in which image information is recognized over a wide range of illuminance, and a second floating diffusion region, in which image information is recognized with high sensitivity, and
signals acquired from the first floating diffusion region and the second floating diffusion region are synthesized, to thereby provide an image signal for the pixel, and
the first floating diffusion region is disposed between a first transfer transistor and a first reset transistor and the second floating diffusion region is disposed between a second transfer transistor and a second reset transistor, and the first and second floating diffusion regions are not connected to a capacitor.

7. The CMOS image sensor of claim 6, wherein at least two pixels among the plurality of pixels share the first floating diffusion region and the second floating diffusion region.

8. The CMOS image sensor of claim 6, wherein a first gate-driving voltage of a transistor, which generates a corresponding potential in the first floating diffusion region, is different from a second gate-driving voltage of a transistor, which generates a corresponding potential in the second floating diffusion region.

9. The CMOS image sensor of claim 6, wherein:
the first floating diffusion region has a capacitance larger than the second floating diffusing region.

10. The CMOS image sensor of claim 6, wherein:
the signal acquired from the first floating diffusion region is output through a first drive transistor and a first select transistor,
the signal acquired from the second floating diffusion region is output through a second drive transistor and a second select transistor, and the acquired signals are then synthesized to provide an image signal.

11. A complementary metal-oxide-semiconductor (CMOS) image sensor comprising:
a first light-receiving unit to convert light into charge;
a first floating diffusion region, in which a first potential corresponding to the converted amount of charge is generated; and
a second floating diffusion region, to which the charge in the first floating diffusion region is transmitted, and in which a second potential is generated,
wherein a wide dynamic range signal is acquired from the first floating diffusion region, a high-sensitivity signal is acquired from the second floating diffusion region, and the acquired signals are synthesized and output, and the first floating diffusion region has a capacitance larger than the second floating diffusing region.

12. A complementary metal-oxide-semiconductor (CMOS) image sensor comprising:
a plurality of pixels,
wherein each of the pixels includes a first floating diffusion region, in which image information is recognized over a wide range of illuminance, and a second floating diffusion region, in which image information is recognized with high sensitivity, and
signals acquired from the first floating diffusion region and the second floating diffusion region are synthesized, to thereby provide an image signal for the pixel, and
the first floating diffusion region has a capacitance larger than the second floating diffusing region.

* * * * *